(12) United States Patent
Gossner (10) Patent No.: US 7,838,948 B2
(45) Date of Patent: Nov. 23, 2010

(54) FIN INTERCONNECTS FOR MULTIGATE FET CIRCUIT BLOCKS

(75) Inventor: Harald Gossner, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 666 days.

(21) Appl. No.: 11/668,916

(22) Filed: Jan. 30, 2007

(65) Prior Publication Data

US 2008/0179635 A1    Jul. 31, 2008

(51) Int. Cl.
*H01L 27/112*    (2006.01)
(52) U.S. Cl. ............................. 257/401; 257/E27.112
(58) Field of Classification Search ................ 257/241, 257/288, 347, 401, E27.112
See application file for complete search history.

(56) References Cited

U.S. PATENT DOCUMENTS

| | | | |
|---|---|---|---|
| 6,060,911 A | 5/2000 | Schultz et al. | |
| 6,169,314 B1 | 1/2001 | Wong | |
| 6,924,178 B2 | 8/2005 | Beintner | |
| 6,924,560 B2 | 8/2005 | Wang et al. | |
| 6,967,351 B2 | 11/2005 | Fried et al. | |
| 6,970,373 B2 | 11/2005 | Datta et al. | |
| 6,977,837 B2 | 12/2005 | Watanabe et al. | |
| 7,282,772 B2* | 10/2007 | Anderson et al. | 257/386 |
| 2004/0099885 A1* | 5/2004 | Yeo et al. | 257/208 |
| 2004/0217408 A1 | 11/2004 | Hofmann et al. | |
| 2005/0094434 A1* | 5/2005 | Watanabe et al. | 365/156 |
| 2007/0045736 A1* | 3/2007 | Yagishita | 257/347 |

FOREIGN PATENT DOCUMENTS

KR    20050063674    6/2005

OTHER PUBLICATIONS

Doyle, B., et al., "Tri Gate Fully Depleted SMOS Transistors: Fabrication, Design and Layout", *2003 Symposium on VLSI Technology, Digest of Technical Papers*, (2003), 2 pgs.
Yang, F.-L., et al., "35 nm CMOS FinFETS", *2002 Symposium on VLSI Technology, Digest of Technical Papers*, (2002), 2 pgs.
Yu, B., et al., "FinFET Scaling to 10 nm Gate Length", *Digest, International Electron Devices Meeting (IEDM '02)*, (2002), 4 pgs.
"Korean Application Serial No. 2008-0009276, Office Action mailed Nov. 17, 2009", 7 pgs.

* cited by examiner

*Primary Examiner*—Lynne A Gurley
*Assistant Examiner*—Colleen A Matthews
(74) *Attorney, Agent, or Firm*—Schwegman Lundberg & Woessner, P.A.

(57) ABSTRACT

In an embodiment, an apparatus includes a first field effect transistor including a first source contact region, a first drain contact region and a first plurality of fins overlying a substrate, a first gate overlying the first plurality of fins, the first source contact region coupled to first ends of the first plurality of fins, and a second field effect transistor including a second source contact region, a second drain contact region, and a second plurality of fins overlying the substrate, a second gate overlying the second plurality of fins, and an interconnection contact region overlying the substrate, electrically coupling the first drain contact region and the second source contact region and abutting the first and the second pluralities of fins.

5 Claims, 9 Drawing Sheets

FIN INTERCONNECTS FOR MULTIGATE FET CIRCUIT BLOCKS

TECHNICAL FIELD

Embodiments described herein relate generally to semiconductor circuits which include multigate field effect transistor devices.

BACKGROUND

Multigate field effect transistor devices are often designed for applications using circuits with down-scaled, extremely small devices. Circuits using multigate field effect transistor devices have large source/drain contact regions.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

In the following description, the terms "wafer" and "substrate" may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "multiple gate field effect transistor" (MuGFET) is used interchangeably with FinFET herein for the general class of semiconductor devices having non-planar field effect transistors formed on fins of semiconductor material.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The term "contact region" is understood to generally include a region that provides electrical connectivity to other devices, circuits, or reference potential sources.

The following disclosure relates in general to providing for operation of structure employing multiple circuit blocks, some of which include MuGFET devices. Multiple MuGFET devices are typically formed above a buried oxide region of a single substrate and supported by the substrate. Because the MuGFET devices are electrically insulated from the substrate and each other by being formed above the buried oxide region, individual devices can be connected to separate sources of reference potential and to separate power supplies. Other semiconductor devices and circuit blocks may also be formed above and supported by the substrate in contact regions thereof which are not insulated by the buried oxide region. The various circuit blocks can be coupled to each other by a suitable coupling element, coupling network or interconnection contact region despite their being operatively coupled to different sources of reference potential. In some embodiments, the source/drain regions of multiple MuGFET devices are shared by the same contact region. In some embodiments, the circuit blocks are driven from different power sources.

Typically, in circuits formed using semiconductor devices, a number of independent devices such as pFET or nFET are used to form various types of analog or digital circuits. Each of the pFET or nFET devices are fabricated on the substrate separately with each device having independent source/drain and gate regions. This type of arrangement of pFET and nFET devices leads to the use of a considerable amount of area available on the semiconductor wafer. In general, circuit using FINFET or MUGFET technology consumes a large source/drain contact region. Moreover, limitations in the pitch of fins in such devices prevents further reduction in area of the circuit on the semiconductor wafer. On the contrary, according to some embodiments of the invention, a shared source/drain region architecture as described below provides for a reduction in the area used on the semiconductor wafer.

Figure 1A:
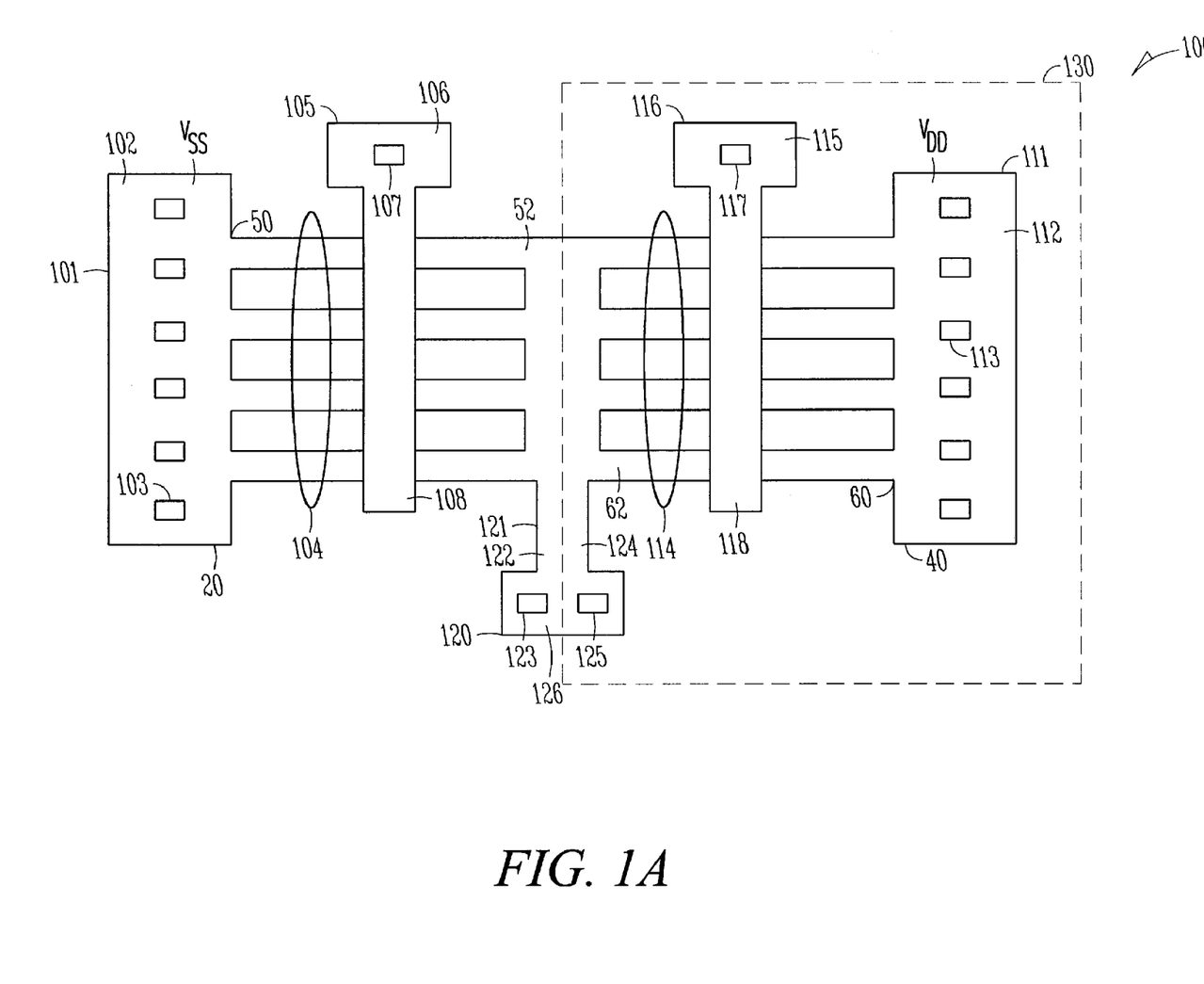
FIG. 1A illustrates a top view of an apparatus showing a shared source/drain region, according to some embodiments of the invention.

FIG. 1A illustrates a top view of an apparatus 100 showing a fin interconnect, according to some embodiments of the invention. In some embodiments, apparatus 100 includes two devices 20 and 40 coupled at an interconnection region 120. In some embodiments, device 20 includes contact regions 101, a set of fins 104 and gate 105 and a first portion 122 of interconnect region 120. In some embodiments, device 40 includes contact regions 111, a set of fins 114 and gate 115 and a second portion 124 of interconnect region 120.

Contact region 101 includes a landing pad 102 having multiple contact elements 103. Contact region 111 includes a landing pad 112 having multiple contact elements 113. Gate 105 includes a landing pad 106 having a contact element 107 and a gate line 108. Gate 115 includes a landing pad 116 having a contact element 117 and gate line 118. Set of fins 104 includes a first end 50 and a second end 52. Set of fins 114 includes a first end 60 and a second end 62. Second end 52 of set of fins 104 abuts and is electrically coupled to the second end 62 of set of fins 114 at the interconnection region 120.

In some embodiments, interconnect region 120 includes a landing pad 126. The second end 52 of the set of fins 104 is coupled to the first portion 122 and the second end 62 of the set of fins 114 is coupled to the second portion 124. Additionally, in some embodiments, the first portion 122 and the second portion 124 are coupled to the landing pad 126. Landing pad 126 includes contact elements 123 and 125. In some embodiments, the contact elements 123 and 125 function as a source/drain regions of a pFET or an nFET device. In some embodiments contact elements 123 and 125 are coupled to other devices or circuits that may be located elsewhere on the semiconductor wafer.

In some embodiments, contact elements 103, 113 and 123, 125 are source/drain regions for a pFET or an nFET device. In some embodiments, region under mask 130 (FIG. 1A) is doped with an n-type dopant and remaining region including contact region 101, gate 105 and set of fins 104 are doped with a p-type dopant. In some embodiments, region under mask 130 (FIG. 1A) is doped with a p-type dopant and remaining region including contact region 101, gate 105 and set of fins 104 are doped with n-type dopant. In some embodiments, the number of fins included in set of fins 104 is different to the number of fins included in set of fins 114.

Figure 1B:
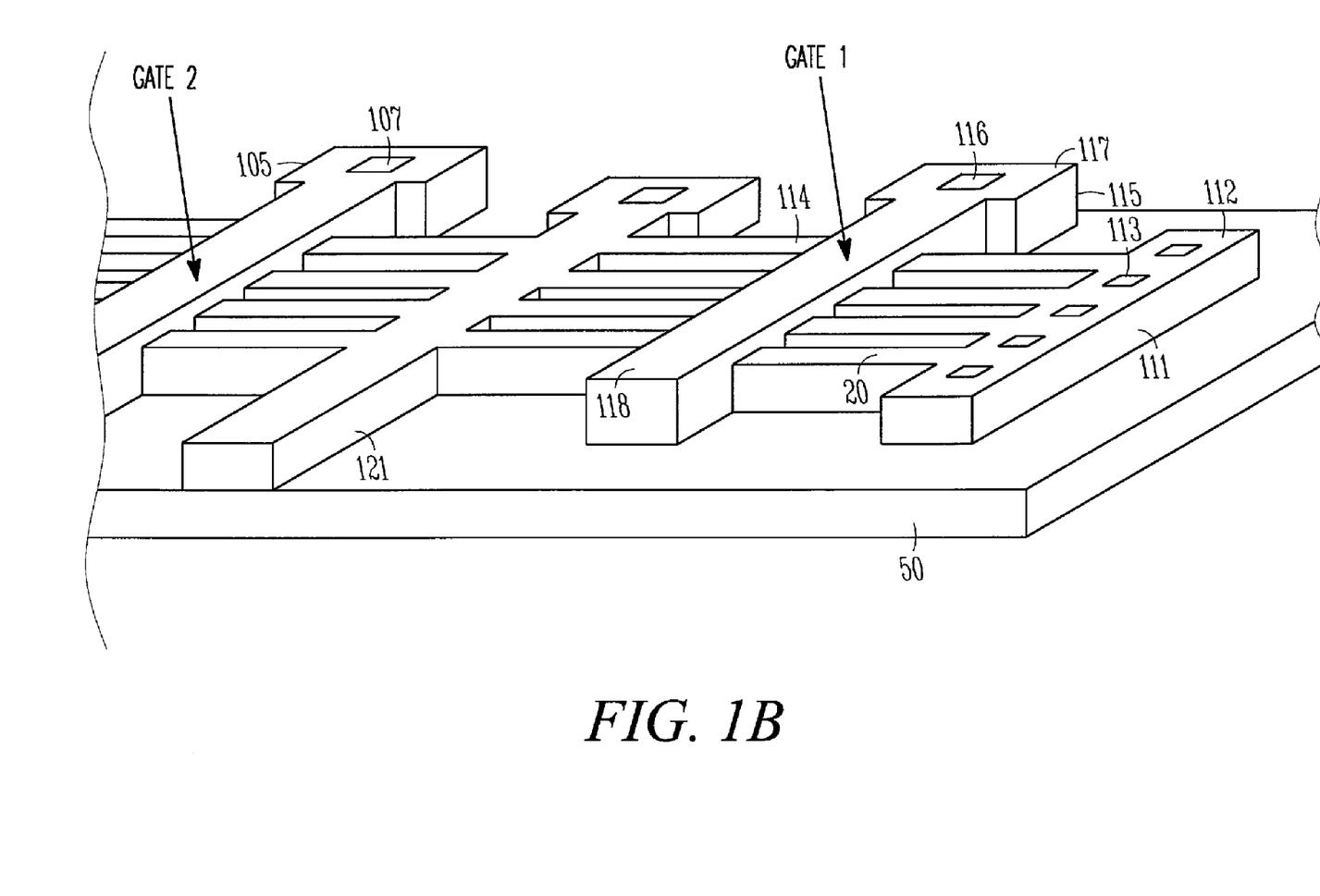
FIG. 1B illustrates a perspective view of a cross-section of apparatus shown in FIG. 1A, according to some embodiments of the invention.

FIG. 1B illustrates a perspective view of a cross-section of a portion of apparatus 100 shown in FIG. 1A, according to some embodiments of the invention. In some embodiments, apparatus 100 is fabricated over a semiconductor substrate 50. Semiconductor substrate 50 used is preferably monocrystalline silicon, although it is also possible to use any other desired semiconductor substrates, such as silicon on insulator (SOI), Germanium or III-IV semiconductors.

Figure 2:
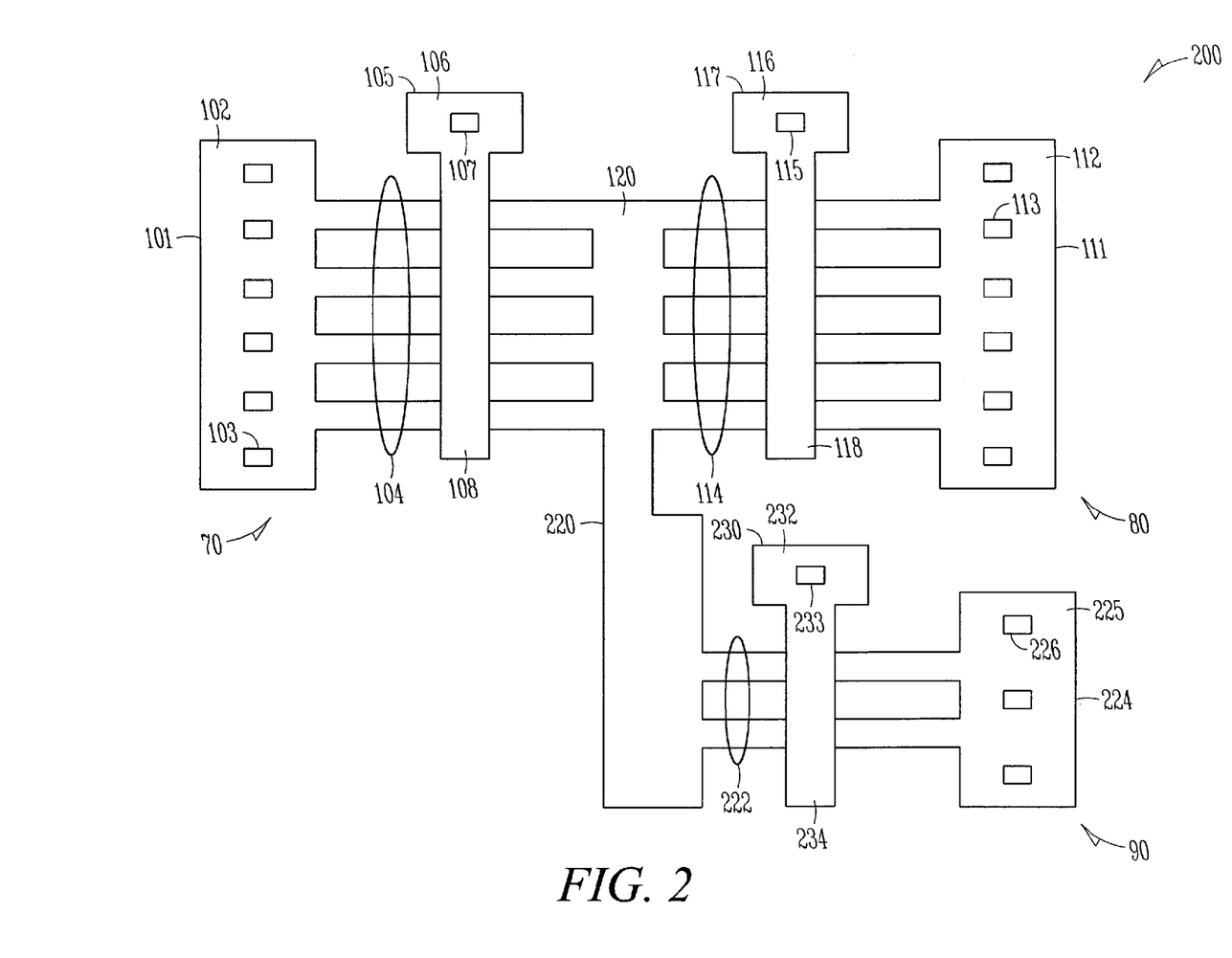
FIG. 2 illustrates a top view of an apparatus showing a fin interconnect, according to some embodiments of the invention.

FIG. 2 illustrates a top view of an apparatus 200 showing a fin interconnect, according to some embodiments of the invention. In some embodiments, apparatus 200 includes three devices 70, 80 and 90 coupled using an interconnection region 120 and an extender 220. In some embodiments, device 70 includes contact region 101, a set of fins 104, a gate 105, the interconnect region 120, an extender 220 and contact region 224. In some embodiments, device 80 includes contact region 111, a set of fins 114, a gate 115, the interconnection region, the extender 220 and contact region 224. In some embodiments, device 90 includes contact regions 224, a set of fins 222, a gate 230, the interconnection region 120, the extender 220 and any one or both of contact regions 101 and 111.

As described above, contact regions 101, 111 include landing pads 102, 112 having multiple contact elements 103, 113, respectively. Gates 105, 115 include gate lines 108, 118 and landing pads 106, 116 having contact elements 107, 117, respectively. Gate 230 includes a gate line 234, a landing pad 232 having a contact element 233. Additionally, set of fins 104 and set of fins 114 are coupled to contact regions 101 and 111, respectively at one end and at the other end are abutted and electrically coupled to each other and the interconnection region 120. Set of fins 222 is coupled to contact region 224 at one end and couple to extender 220 at the other end. In some embodiments, extender 220 provides electrical coupling between the interconnection region 120 and other circuits and/or devices.

In some embodiments, contact elements 103, 113 and 226 are source/drain regions of a pFET or an nFET device. In some embodiments, various portions of apparatus 200 are doped with an n-type dopant using a mask and remaining region is doped with a p-type dopant. In some embodiments, various portions of apparatus 200 are doped with a p-type dopant using a mask and remaining region is doped with an n-type dopant. In some embodiments, the number of fins included in set of fins 104 is different to the number of fins included in set of fins 114 and the number of fins in set of fins 222.

Figure 3:
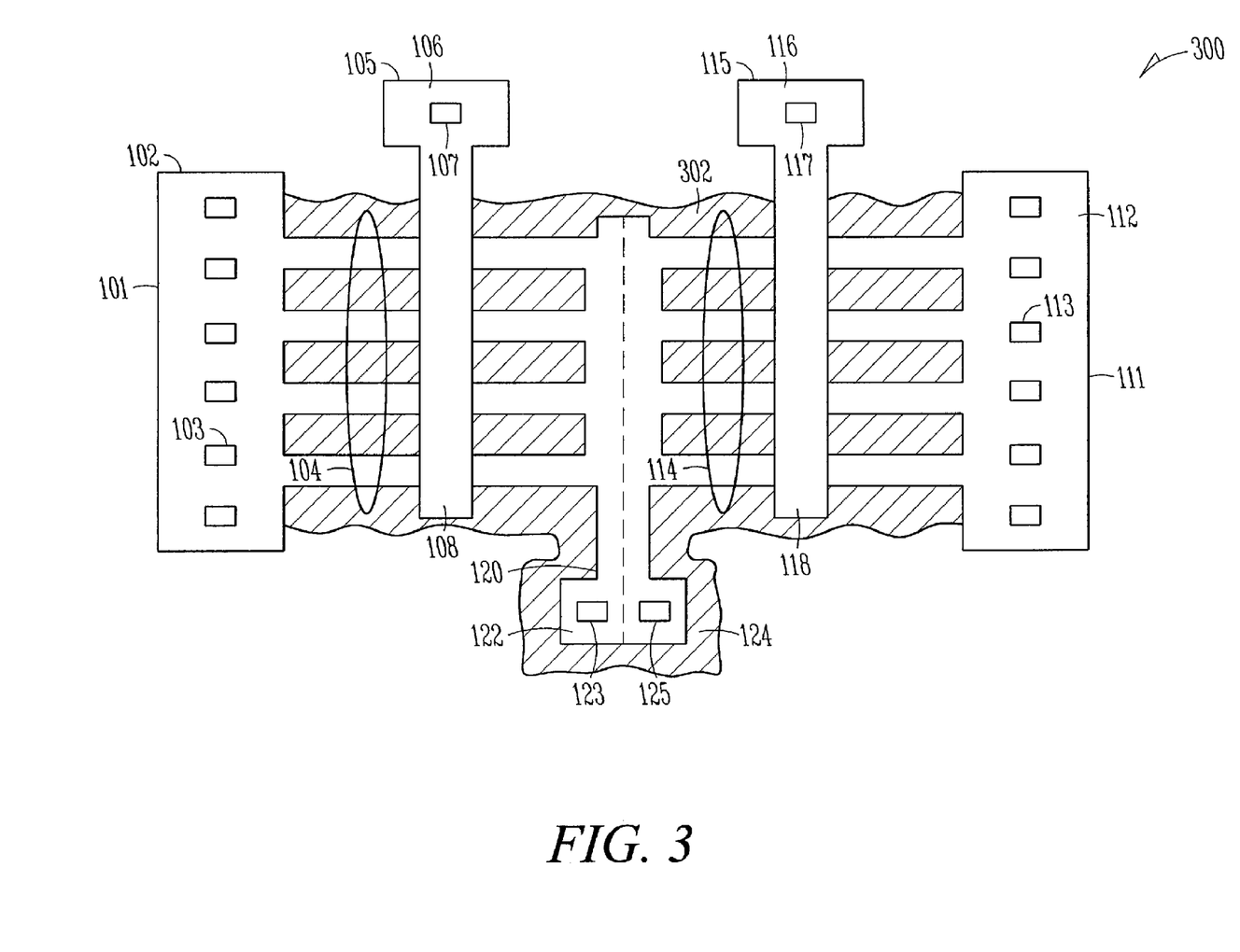
FIG. 3 illustrates a top view of an apparatus showing a shared source/drain region as in FIG. 1A with epitaxially grown silicon in between the fins, according to some embodiments of the invention.

FIG. 3 illustrates a top view of an apparatus showing a fin interconnect, according to some embodiments of the invention. In some embodiments, apparatus 300 includes silicon 302 deposited in between the fins shown in apparatus FIG. 1A. Typically, silicon may be grown on the sides of the fins using a selective epitaxial growth (SEG) process. The selective epitaxial growth process is performed after the formation of gates 105 and 115 on top of set of fins 104 and 114, respectively. Typically, during the SEG process, a silicon film grows only in those areas where single-crystal silicon is present and is suppressed elsewhere.

Figure 4:
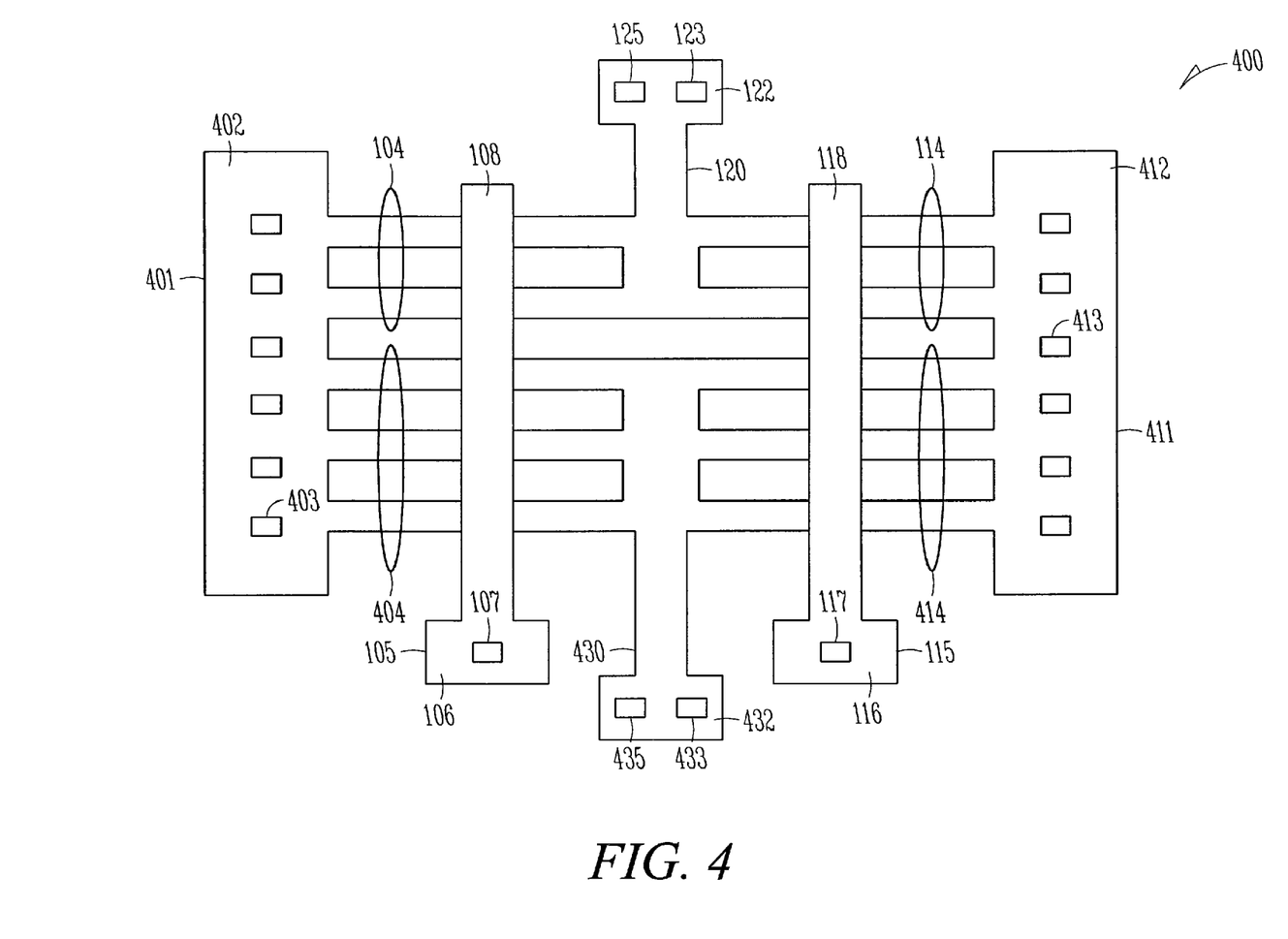
FIG. 4 illustrates a top view of an apparatus showing shared source/drain regions and shared gates, according to some embodiments of the invention.

FIG. 4 illustrates a top view of an apparatus 400 showing shared local interconnects and shared gates, according to some embodiments of the invention.

In some embodiments, apparatus 400 includes contact regions 401 and 411, set of fins 104, 114, 404 and 414, interconnect contact regions 120 and 430, gates 105 and 115. One end of set of fins 104 and 404 is coupled to contact region 401. One end of set of fins 114 and 414 is coupled to contact region 411. In some embodiments, the remaining end of set of fins 104 and 114 are abutted and electrically coupled to interconnect region 120. In some embodiments, the remaining end of set of fins 404 and 414 abut and are electrically coupled to interconnect region 430. Interconnect region 120 includes a landing pad 122 having contact elements 123 and 125. Interconnect region 430 includes a landing pad 432 having contact elements 433 and 435. In some embodiments, the number of fins in set of fins 104 is different from the number of fins in set of fins 114. In some embodiments, the number of fins in set of fins 404 is different from the number of fins in set of fins 414. Gates 105, 115 include gate lines 108, 118, landing pads 106, 116 having contact elements 107, 117, respectively.

In some embodiments, apparatus 400 shown in FIG. 4 includes multiple devices sharing the same gate. In some embodiments, apparatus 400 includes multiple devices sharing a source/drain region. In some embodiments contact elements 123, 125, 433 and 435 are coupled to other devices or circuits that may be located elsewhere on the semiconductor wafer.

Figure 5:
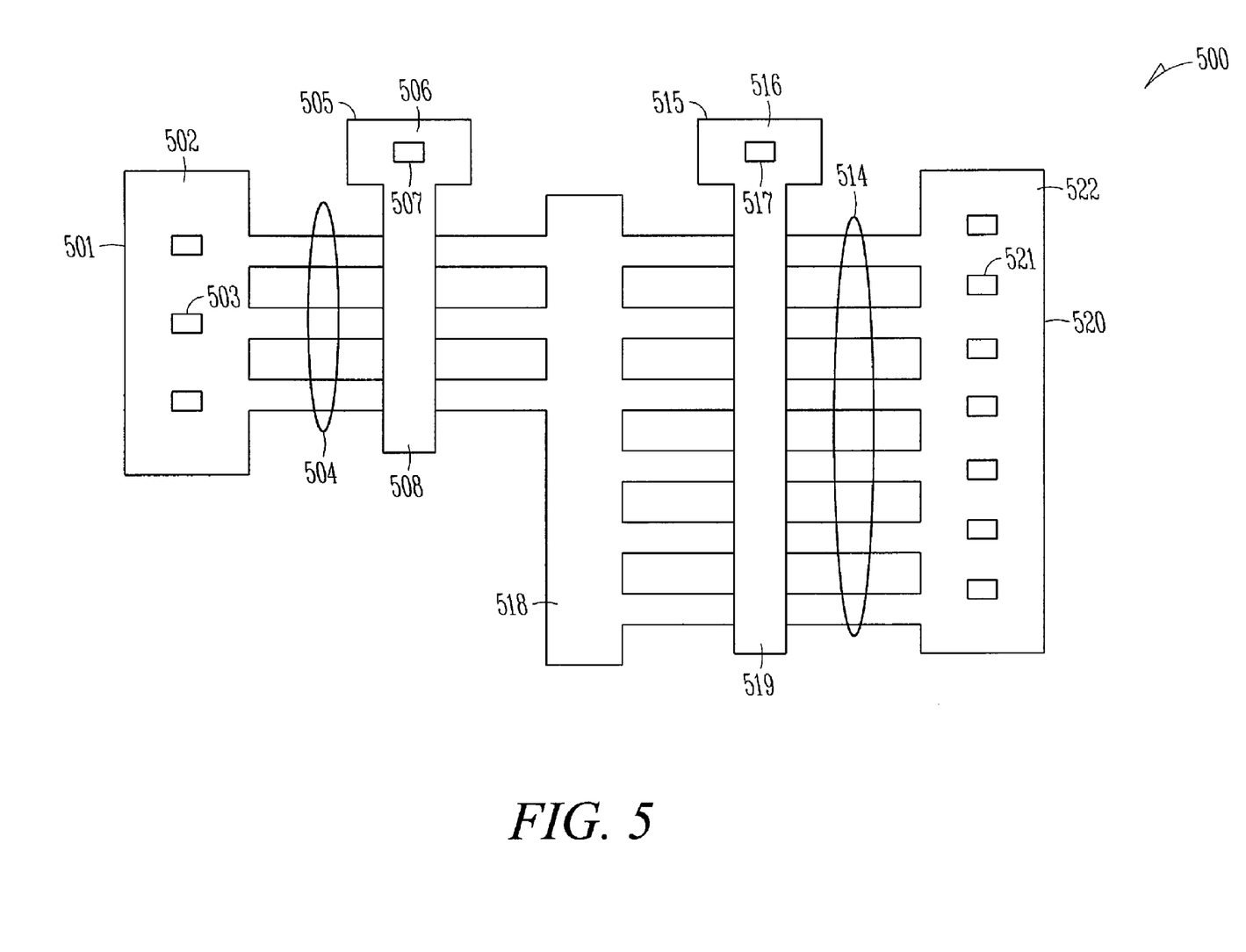
FIG. 5 illustrates a top view of an apparatus showing a fin interconnect, according to some embodiments of the invention.

FIG. 5 illustrates a top view of an apparatus 500 showing a fin interconnect, according to some embodiments of the invention. In some embodiments, apparatus 500 includes contact regions 501 and 520, gates 505 and 515, interconnect contact region 518, and a set of fins 504 and 514. Contact regions 501, 520 include landing pads 502, 522 each having contact elements 503, 521, respectively. In some embodiments, the number of fins that make up the set of fins 504 differ from the number of fins in set of fins 514. In some embodiments, the number of contact elements 503 differ from the number of contact elements 521. Gates 505, 515 include landing pads 506, 516 and gate lines 508, 519, respectively. Landing pads 506, 516 include contact elements 507, 517, respectively. In some embodiments, contact regions 501, 520 are coupled to source/drain.

Figure 6:
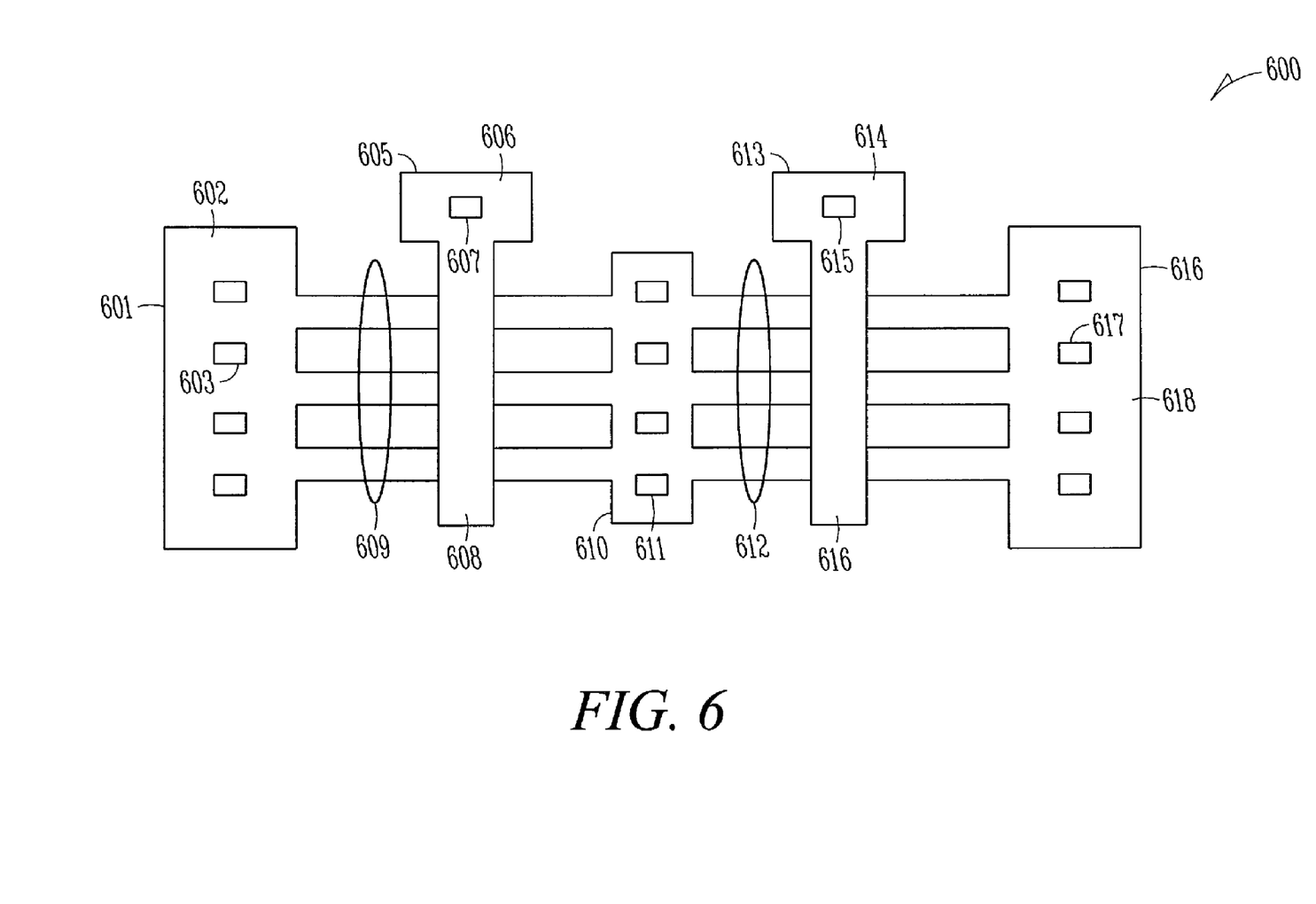
FIG. 6 illustrates a top view of an apparatus showing a fin interconnect including contact elements, according to some embodiments of the invention.

FIG. 6 illustrates a top view of an apparatus 600 showing a fin interconnect with contact elements, according to some embodiments of the invention. In some embodiments, apparatus 600 includes contact regions 601 and 616, set of fins 609 and 612, gates 605 and 613, and interconnect contact region 610. In some embodiments, contact region 601, 616 include landing pads 602, 618, respectively. Landing pads 602, 618 include contact elements 603, 617, respectively. Gates 605, 613 include gate lines 608, 616 and landing pads 606, 614, respectively. Landing pads 606, 614 include contact elements 607, 615, respectively. In some embodiments, interconnect contact region 610 includes multiple contact elements 611. In some embodiments, contact elements 603, 617 and 611 are coupled to source/drain. In some embodiments contact elements 603, 617 and 611 are coupled to other devices, circuits or reference potentials.

Figure 7:
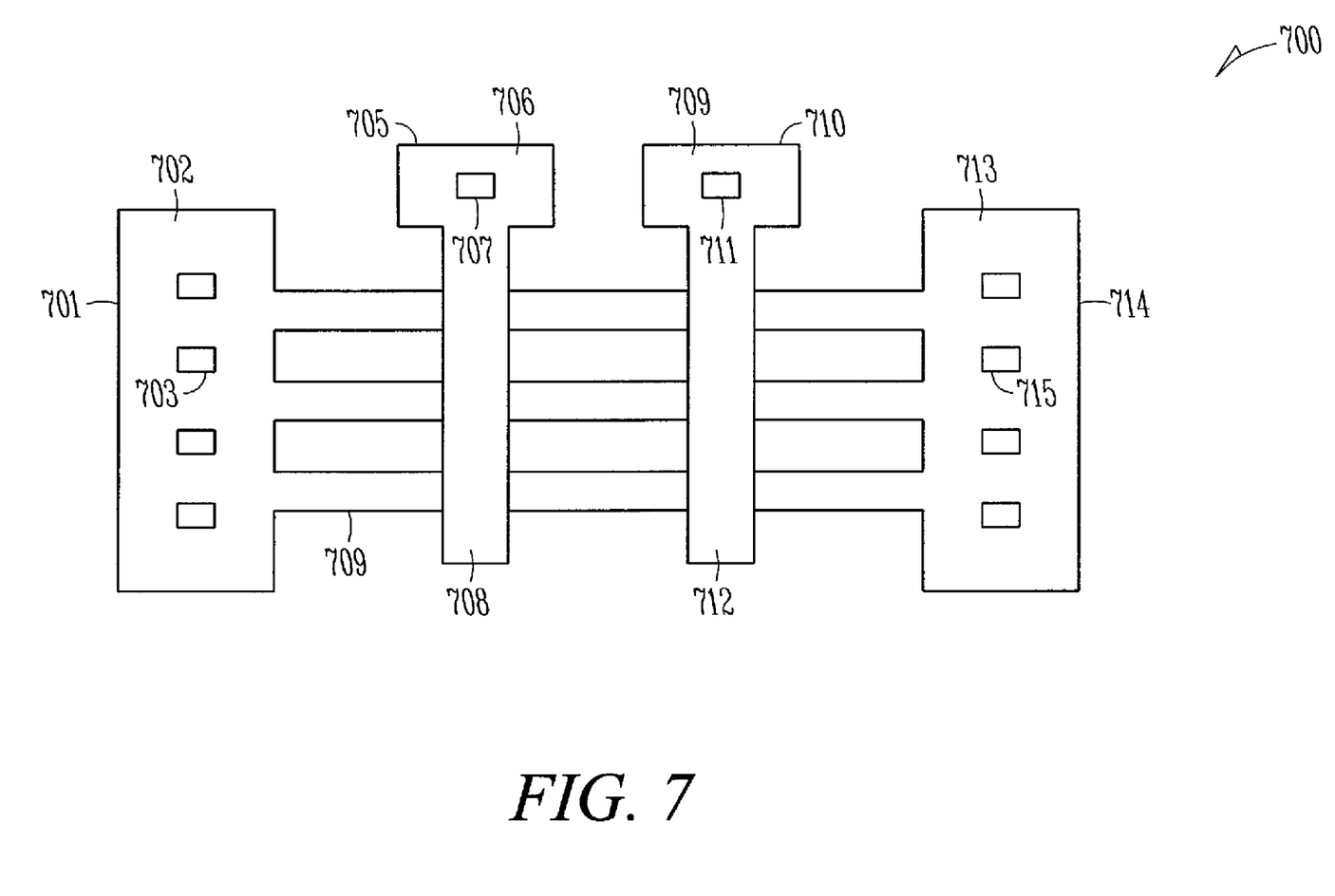
FIG. 7 illustrates a top view of an apparatus showing shared source and drain regions of stacked transistors using a part of the common fin, according to some embodiments of the invention.

FIG. 7 illustrates a top view of an apparatus 700 showing shared source and drain regions of stacked transistors using a part of the common fin without dedicated contact regions, according to some embodiments of the invention.

In some embodiments such as shown in FIG. 7 provides for a savings in the area of an interconnect contact region provided between stacked transistors. This can be easily seen by comparing to the embodiment shown in FIG. 6. In 700, there are no contact elements present for the shared region. The region of the fin 709 between the gates 708 and 712 is either homogenously implanted by a first implantation according to the implantation type of the landing pads 702 and 713 or receives a first implant close to the gate 708 and a second implant close to gate 712 according to the implant of region 702 and 713, respectively. The border between the implantation of first type and second type on fin 709 between gates 708 and 712 is defined by a lithographic mask. In some embodiments, such as in the case of implantation of different types, the ohmic contact is ensured by a common silicide region between gate 708 and 712.

Figure 8:
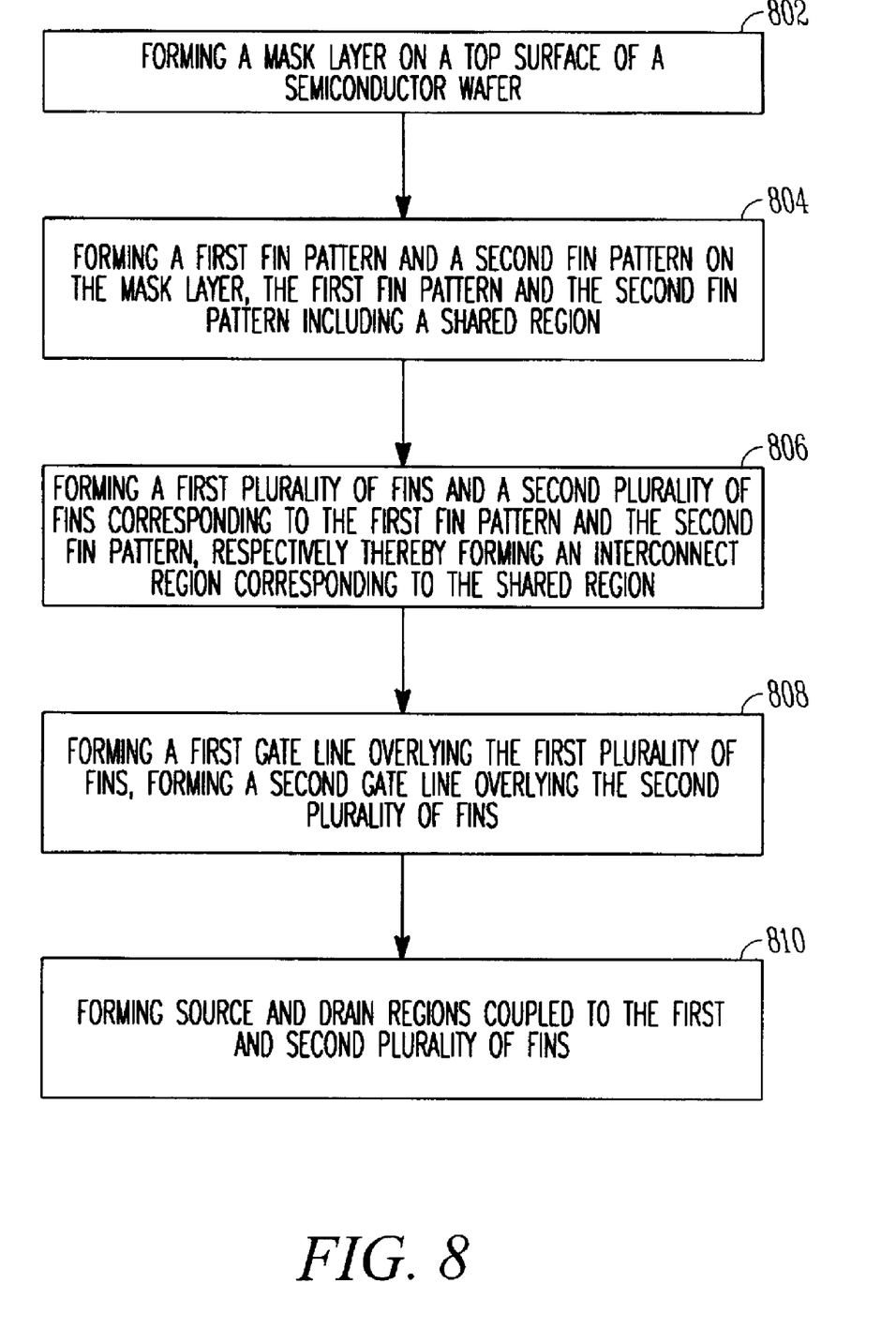
FIG. 8 illustrates a method of fabrication of a fin interconnect, according to some embodiments of the invention.

FIG. 8 illustrates a method of fabrication of a fin interconnect, according to some embodiments of the invention.

At 802, the method includes forming a mask layer on a top surface of a silicon on insulator substrate. In some embodiments, the substrate is made of silicon. In other embodiments, the substrate can be made of other semiconductor materials, like germanium, and gallium arsenate. In an embodiment, the substrate can be of a BOX (Buried Oxide) structure. In another embodiment, the substrate can be of a SOI (Silicon On Insulator) structure.

At 804, the method includes forming a first fin pattern and a second fin pattern on the mask layer. In some embodiments, the first fin pattern and the second fin pattern include a shared region interposed between their adjacent edges.

At 806, the method includes forming a first plurality of fins determined by the first fin pattern. The method also includes forming a second plurality of fins determined by the second fin pattern. In some embodiments, the first plurality of fins and the second plurality of fins include an interconnect contact region corresponding to the shared region. In some embodiments, the method includes doping the first plurality of fins using a p-type dopant and doping the second plurality of fins using an n-type dopant.

At 808, the method includes forming a first gate line operatively coupled and supported by the first plurality of fins and a second gate line operatively coupled and supported by the second plurality of fins.

At 810, the method includes forming source and drain regions coupled to the first and second plurality of fins. In some embodiments, the method includes growing silicon in between each of the first plurality of fins and the second plurality of fins using a selective epitaxial growth (SEG) process.

In some embodiments described above, the fin is made of silicon. In other embodiments, the fin can be made of other semiconductor materials, like germanium, silicon carbide, gallium arsenate, as well as indium phosphate. In some embodiments, the fin may be coated with a thin film of silicide, for example, with a thickness of 10 nm approximately.

In some embodiments, the contact element is made of tungsten. In other embodiments, the contact element is made of materials such as tungsten, copper, silver, gold, and/or aluminum. The contact element may be produced by using conventional etching process, for example, etching an opening (or a hole) selectively to the bottom or the side of the fin, then filling the opening with tungsten (or other conductive material), thus forming the contact element, which partially wraps around the fin. Alternatively, before filling the opening, a thin film of TiN can be applied to the opening as a liner.

In some embodiments, the fin is substantially in the shape of a rectangle. In other embodiments, the fin is substantially in the shape of a rectangle with corners rounded. In an embodiment, the height to width ratio of the fin can be substantially in the range of 3:1 to 5:1. In an embodiment, the width of the fin is substantially 20 nm.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus comprising:
a first field effect transistor including a first source contact region, a first drain contact region and a first plurality of fins overlying a substrate, a first gate overlying the first plurality of fins, the first source contact region coupled to a first end of the first plurality of fins;
a second field effect transistor including a second source contact region, a second drain contact region, and a second plurality of fins overlying the substrate, a second gate overlying the second plurality of fins, the second drain contact region coupled to a first end of the second plurality of fins; and
an interconnection contact region overlying the substrate, electrically contacting the first drain contact region and the second source contact region and abutting a second end of the first plurality of fins and a second end of the second plurality of fins, wherein the first field effect transistor includes an nFET and the second field effect transistor includes a pFET.

2. The apparatus of claim 1, wherein the substrate comprises a silicon on insulator substrate.

3. The apparatus of claim 1, wherein the interconnection contact region extends in a direction perpendicular to the first and the second pluralities of fins and is electrically coupled to a first end of a third plurality of fins.

4. The apparatus of claim 1, further comprising epitaxially grown silicon between at least one of each of the first plurality of fins and each of the second plurality of fins.

5. The apparatus of claim 1, wherein the interconnection region includes a contact region.

* * * * *